United States Patent [19]

Humenik et al.

[11] Patent Number: 4,937,930

[45] Date of Patent: Jul. 3, 1990

[54] METHOD FOR FORMING A DEFECT-FREE SURFACE ON A POROUS CERAMIC SUBSTRATE

[75] Inventors: James N. Humenik, LaGrangeville; Ekkehard F. Miersch, Briarcliff Manor; Charles H. Perry, Poughkeepsie; Janusz S. Wilczynski, Ossining, all of N.Y.

[73] Assignee: International Business Machines Corporation, Armonk, N.Y.

[21] Appl. No.: 417,365

[22] Filed: Oct. 5, 1989

[51] Int. Cl.⁵ .......................................... B23P 17/00
[52] U.S. Cl. ................................. 29/527.4; 29/846; 204/15; 204/30; 204/38.4; 427/11; 427/140; 427/357; 427/360; 427/367; 427/444
[58] Field of Search ............... 29/846, 527.5; 427/11, 427/140, 357, 359, 360, 367, 369, 444; 204/15, 38.4, 30, 35.1

[56] References Cited

U.S. PATENT DOCUMENTS

| | | | |
|---|---|---|---|
| 2,914,425 | 11/1959 | McGuire | 427/11 |
| 3,528,893 | 9/1970 | Christie et al. | 204/38.4 |
| 3,557,446 | 1/1971 | Charschan . | |
| 3,776,308 | 10/1973 | Loro | 174/68.5 |
| 3,891,514 | 6/1975 | Klemm | 209/15 |
| 4,022,585 | 5/1977 | Kaye | 204/30 X |
| 4,131,516 | 12/1978 | Bakos et al. | 204/15 |
| 4,175,010 | 11/1979 | Koel et al. | 204/38.4 X |
| 4,183,137 | 1/1980 | Lornerson . | |
| 4,519,877 | 5/1985 | Wiech, Jr. | 204/15 |
| 4,652,336 | 3/1987 | Andrascek et al. | 204/15 X |
| 4,663,480 | 5/1987 | Ubbens | 29/853 |
| 4,849,302 | 7/1989 | Ostwald | 204/15 X |

Primary Examiner—Carl E. Hall
Assistant Examiner—Carl J. Arbes
Attorney, Agent, or Firm—John J. Goodwin

[57] ABSTRACT

A process for hermetically sealing defects in a porous ceramic substrate comprising the steps of evaporating or sputtering a malleable metal layer onto the defective porous ceramic surface, swaging or smearing the malleable metal layer over the defects and depositing a second metal film over the swaged first film to provide a smooth defect free surface.

4 Claims, 1 Drawing Sheet

METHOD FOR FORMING A DEFECT-FREE SURFACE ON A POROUS CERAMIC SUBSTRATE

BACKGROUND OF THE INVENTION

1. Field of the Invention

The present invention relates to the fabrication of printed circuit boards and more particularly to a fabrication process for forming a hermetic seal for a printed circuit board that provides a defect-free surface.

2. Description of the Prior Art

U.S. Pat. No. 3,346,950, issued Oct. 17, 1967 to Schick entitled METHOD OF MAKING THROUGH-CONNECTIONS BY CONTROLLED PUNCTURES, discloses a method and means for establishing small area through connections, between conductors disposed on opposite faces of an insulator. At desired points of interconnection, a small area of a conductive line element on one surface of an insulator body is depressed into and through the adjacent insulator material into contact with a point on a conductor on the opposite surface of the insulator body. The opposite conductor is backed by a supporting plate or the equivalent to arrest the movement of the depressing tool at its inner surface. The depressing tool is shaped to exert a stressing force on the depressed conductor to a point beyond the elastic limit of its constituent material such that worked material of this conductor is capable of withstanding the tendency of the displaced insulator material to relax into its former position after removal of the depressing tool. The connection thus formed may be electrically and structurally reinforced by plating additional conductive matter into the depressions utilizing the undeformed conductors as receiving electrodes of a plating system.

U.S. Pat. No. 3,557,446, issued Jan. 26, 1971 to Charschan entitled METHOD OF FORMING PRINTED CIRCUIT BOARD THROUGH-CONNECTIONS, describes a structure wherein a transversely deformable, conductive foil sheet is positioned over one or more holes in, and in contact with, a major surface of a nonconductive substrste. Uniform pressure is applied to the free major surface of the sheet with a hydraulic medium such as a rubber pad. Such pressure extrudes, explodes or ruptures the unsupported portion of the sheet over the hole therein to produce a through-connection.

U.S. Pat. No. 3,766,308, issued Oct. 16, 1973 to Loro entitled JOINING CONDUCTIVE ELEMENTS ON MICROELECTRONIC DEVICES, relates to a method of interconnecting adjacent conductors upon a support member, particularly in a microelectronic device. The portions of the conductors to be connected are provided with nodules or pads of malleable metal which may be deformed and spread into one another to form a cold weld useful for the interconnection of conductive tracks on integrated circuit or similar devices.

U.S. Pat. No. 4,183,137, issued Jan. 15, 1980 to Lornerson entitled METHOD FOR METALIZING HOLES IN INSULATION MATERIAL, discloses a method for metalizing the surface walls of a printed circuit board through hole to produce an electrically conductive path from one metallic layer of the board through the insulating plate to another metallic layer. A drill bit is forced through the board and into a block of soft conductor material. While the bit is turning, the conductive cuttings from the block are carried to the hole in the insulating plate and smeared on the wall surface by the bit. The smeared conductive material creates an electrically conductive path between two metallic layers of the printed circuit board.

U.S. Pat. No. 4,663,840, issued May 12, 1987 to Ubbens et al entitled METHOD OF INTERCONNECTING CONDUCTORS OF DIFFERENT LAYERS OF A MULTILAYER PRINTED CIRCUIT BOARD, relates to a method of interconnecting conductors of different layers of a multilayer printed circuit board by forming a depression in the relevant conductor of the outermost layer so that the insulation layer(s) is deformed and contact is made between the outermost layer and the appropriate conductor(s) of the next layer or layers. The method can be used in multilayer printed circuits on a substrate and in flexible multilayer printed circuits on an electrically insulating foil. In the latter case, a temporary backing surface is required for the depression process. The substrate or the temporary backing surface must be deformable to a sufficient degree.

SUMMARY OF THE INVENTION

An object of the present invention is to provide a process for hermetically sealing defects in a porous ceramic substrate comprising the steps of evaporating or sputtering a malleable metal layer onto the defective porous ceramic surface, swaging or smearing the malleable metal layer over the defects and depositing a second metal film over the swaged first film to provide a smooth defect free surface.

DESCRIPTION OF THE PREFERRED EMBODIMENT

Substrates composed of porous ceramic upon which a layer of cooper film is disposed for integrated circuit applications are well known in the art. A major problem with such substrates is that they contain surface defects, that is, topological variations in the substrate surface. Efforts have been made to seal such defects by evaporating or sputtering a layer of metal onto the surface, however, when the defect was shallow but wide, the thickness of the deposited layer was not sufficient to fill the defect, and when the defect was narrow but deep, the defect was replicated in the film.

Figure 1:
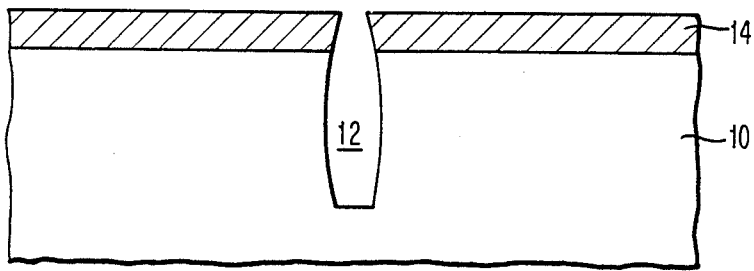
FIG. 1 is a schematic illustration of a cross section of a porous ceramic substrate having a defect therein and an evaporated film thereon with the substrate defect replicated in the film.

Referring to FIG. 1, a porous ceramic substrate is illustrated having a defect 12 therein. A metal film 14 deposited over the surface of substrate 10 also demonstrates the defect. The metal film 14, deposited by evaporation or sputtering, is in order of 5 to 8 microns thick.

In the present invention, a metal film 14 is evaporated or sputtered onto a substrate 10 in a first step as shown in FIG. 1.

Figure 2:
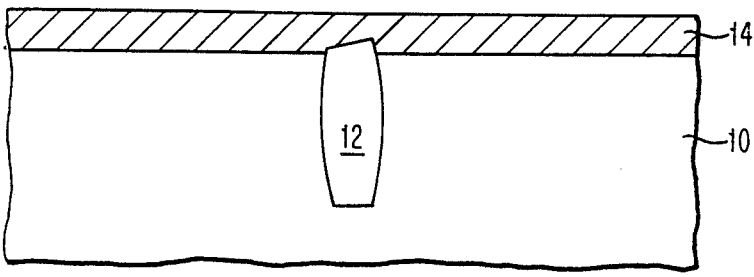
FIG. 2 is a schematic illustration of the structure of FIG. 1 after the metal film has been mechanically smeared or swaged by a process step according to the present invention.

In the next step, the metal film is swaged or smeared such that the defects 12 are smoothed over as shown in FIG. 2. As a result of the swaging step, some of the thickness of metal film 14 is lost in the process and the depth of the layer 14 in FIG. 2 becomes, for example, 2-5 microns.

Figure 3:
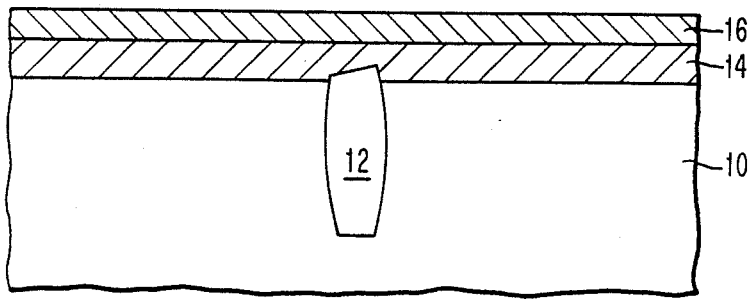
FIG. 3 is a schematic illustration of the structure of FIG. 2 after a second layer of metal has been disposed thereon in a process step according to the present invention.

After the swaging step 2, a second layer of metal 16 is deposited over layer 14 and the defect 12 is completely covered as shown in FIG. 3 thus making the defect 12 hermetic or impervious to solvent entrapment.

The metal layers applicable for the process of the present invention can be any malleable metal such as cooper, aluminum, gold, silver, ect.

The process step to swage or smear the metal can be conventional micromachining or polishing techniques using a lapping or grinding wheel with suitable media.

Figure 4:
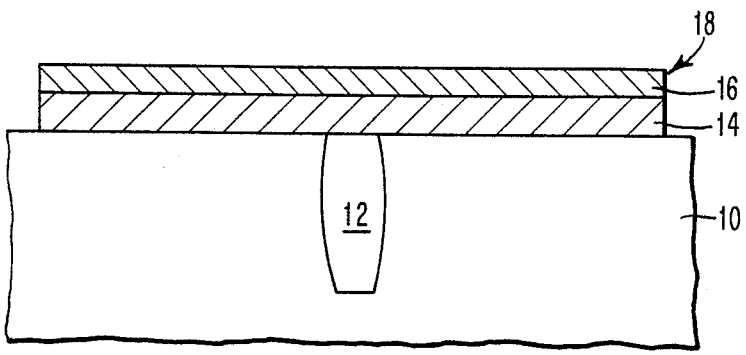
FIG. 4 is a schematic illustration of the structure of FIG. 3 after a further layer of material has been disposed thereon in a process step according to the present invention.

After layer 16 is deposited and merged with layer 14, a capture pad 18 can be formed over the structure in a step 4 using photolithographic techniques to provide a final structure illustrated in FIG. 4.

Having thus described our invention, what we claim as new and desire to secure by Letters Patents is:

1. Aethod for hermetically sealing defects in a porous ceramic substrate comprising the steps of:
   (step 1) evaporating or sputtering a metal layer onto the defective porous ceramic substrate surface,
   (step 2) swaging or smearing the metal layer over the defects to cover any openings in said metal layer, and
   (step 3) depositing a second metal film over the swaged first film to provide a smooth, defect free surface.

2. A method for hermetically sealing defects according to claim 1 wherein said metal layer is composed of a malleable metal where in said malleable metal, is cooper, aluminum, gold or silver.

3. A method for hermetically sealing defects according to claim 1 wherein said metal is swaged by micromachining or polishing techniques.

4. A method for hermetically sealing defects according to claim 1 further including the step of depositing a capture path over said second metal layer by photolithographic techniques.

* * * * *